(12) United States Patent
Ko et al.

(10) Patent No.: US 6,891,729 B2
(45) Date of Patent: May 10, 2005

(54) MEMORY MODULE

(75) Inventors: Ki-Hyun Ko, Kyungki-do (KR); Kwang-Seop Kim, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 193 days.

(21) Appl. No.: 10/197,156

(22) Filed: Jul. 16, 2002

(65) Prior Publication Data

US 2003/0048616 A1 Mar. 13, 2003

(30) Foreign Application Priority Data

Sep. 10, 2001 (KR) .......................... 2001-55463

(51) Int. Cl.$^7$ .......................... H05K 7/02; H05K 1/00
(52) U.S. Cl. .................... 361/736; 361/760; 361/782; 361/783; 361/728; 174/250; 174/260
(58) Field of Search .................... 361/736, 728, 361/729, 734, 738, 748, 749, 760, 761, 735, 764, 763, 765, 766, 784, 785, 783, 782; 174/250, 260

(56) References Cited

U.S. PATENT DOCUMENTS

| | | | | |
|---|---|---|---|---|
| 5,307,309 A | * | 4/1994 | Protigal et al. ............... | 365/63 |
| 5,513,135 A | * | 4/1996 | Dell et al. ..................... | 365/52 |
| 5,941,447 A | | 8/1999 | Chu et al. | |
| 5,949,657 A | * | 9/1999 | Karabatsos .................. | 361/803 |
| 6,038,132 A | * | 3/2000 | Tokunaga et al. ........... | 361/760 |
| 6,070,217 A | * | 5/2000 | Connolly et al. ........... | 710/131 |
| 6,097,883 A | * | 8/2000 | Dell et al. ................... | 395/282 |
| 6,115,278 A | * | 9/2000 | Deneroff et al. .............. | 365/52 |
| 6,160,718 A | * | 12/2000 | Vakilian ...................... | 361/803 |
| 6,169,325 B1 | * | 1/2001 | Azuma et al. ............... | 257/685 |
| 6,184,737 B1 | * | 2/2001 | Taguchi ....................... | 327/319 |
| 6,222,739 B1 | * | 4/2001 | Bhakta et al. ............... | 361/790 |
| 6,246,588 B1 | * | 6/2001 | Kim et al. ................... | 361/786 |
| 6,262,890 B1 | * | 7/2001 | Dhawan et al. .............. | 361/690 |
| 6,330,164 B1 | * | 12/2001 | Khandros et al. ........... | 361/760 |
| 6,344,765 B2 | * | 2/2002 | Taguchi ....................... | 327/333 |
| 6,392,897 B1 | * | 5/2002 | Nakase et al. ............... | 361/785 |
| 6,502,161 B1 | * | 12/2002 | Perego et al. ................... | 711/5 |
| 6,611,434 B1 | * | 8/2003 | Lo et al. ...................... | 361/760 |

* cited by examiner

Primary Examiner—David Martin
Assistant Examiner—Dameon E. Levi
(74) Attorney, Agent, or Firm—Marger Johnson & McCollom, P.C.

(57) ABSTRACT

A memory module preferably includes a printed circuit board (PCB) panel having multiple memory chip pad groups arranged on both sides thereof. Each memory chip pad group preferably includes multiple pads that correspond to lead lines of multiple memory chips arranged on the PCB panel. Connectors are preferably formed along an edge of the PCB panel to electrically connect the memory chip pad groups to an external device. Multiple damping chip pad groups preferably include built-in damping chips. One or more of the damping chip pad groups are preferably arranged adjacent to a lateral edge of one or more of the memory chips. The damping chip pad groups can electrically connect the connectors to the memory chip pad groups and dampen the signal noises.

23 Claims, 5 Drawing Sheets

MEMORY MODULE

CROSS REFERENCE

This application claims priority from Korean Patent Application No. 2001-55463, filed Sep. 10, 2001, the contents of which are hereby incorporated by reference in their entirety.

BACKGROUND OF THE INVENTION

1. Field of the Invention

The present invention relates to a memory module including a printed circuit board (PCB), and more particularly, to a volatile memory module and PCB such as a Dynamic Random Access Memory (DRAM) or a Static Random Access Memory (SRAM) module.

2. Description of Related Art

A conventional memory module configured for installation in a personal computer (PC), a system server, or a communication switching system typically includes an off-chip printed circuit board (PCB) equipped with a memory integrated circuit (IC). The memory module further typically includes a connector for connecting the memory module to an external device. The connector exchanges an electrical data query (DQ) signal with the external device to read data from and record data to the memory chip.

Without a damping resistor between a Synchronized DRAM (SDRAM) and an edge tab, a signal reflection (such as overshooting or undershooting of the DQ signal) may occur. A damping chip that can prevent over/undershooting is therefore generally included in the memory module.

FIG. 5 is a schematic diagram of a conventional memory module. As shown in FIG. 5, a conventional memory module includes a rectangular, panel-type PCB 1100 having a length greater than a height thereof. Memory chips 1110 are arranged in a single line along the length of the PCB 1100 and connectors 1130 are formed along a lower edge of the PCB 1100. Damping chips 1120 are arranged between the connectors 1130 and the memory chips 1110, to prevent over/undershooting of the DQ (data input/output) signal. This memory module configuration increases the memory capacity of the system but limits the ability to reduce the size of the memory module to accommodate smaller system implementations. In particular, since the damping chips 1120 are positioned between the memory chips 1110 and the connectors 1130, there is a limit to the amount by which the memory module height can be reduced and, in turn, to the reduction in a size of the device where the memory module is configured to be inserted.

SUMMARY OF THE INVENTION

To solve the above-described problems, an object of the present invention is to provide a memory module configuration having a PCB of a reduced size to permit implementation in a smaller system, while maintaining the same or increased memory capacity.

To achieve the above object, according to one embodiment of the present invention, a memory module includes a PCB. The PCB is preferably a rectangular, panel-type PCB having a length greater than a height thereof. Pads, corresponding to the lead lines formed in the memory chips, are preferably arranged on a face of the PCB. Multiple memory chips, each having multiple lead lines, are arranged on the front and/or rear sides of the PCB. Connectors are formed along one edge of the PCB to electrically connect the memory chips to an external device. Damping chips are arranged between the memory chips to electrically connect the connectors to the memory chips and damp the electrical signals.

The memory chips are preferably rectangular, double-sided memory chips having multiple lead lines formed along both longitudinal edges. The lead lines are preferably arranged at regular intervals in a single line along the length of the PCB. In the case of Dynamic Random Access Memory (DRAM), various types of memory chips can be used. A Synchronized DRAM (SDRAM) could also be used.

The connectors formed along a lower edge of the PCB preferably include multiple connection pads configured to be electrically connected to the lead lines of the memory chips. The connection pads are arranged at regular intervals in a single line along the length of the connectors. In addition, since the connection pads are made of thin metal panels with high conductivity, they can transfer undamped electrical signals without noise.

Preferably, a damping circuit including at least one resistor is provided in a damping device to prevent the over/undershooting that may be caused by the signal exchange between the memory chips and the external device. Most preferably, a four-array register including four resistors is used in the circuit configuration. Two damping chips that include the damping circuits are preferably arranged alongside the memory chips, in a line parallel to the lateral edges of the PCB to occupy less space.

As described above, in a memory module constructed according to the preferred embodiment of the present invention, since two damping circuits are arranged alongside the memory chips, the PCB can be manufactured having a shorter height, and the size of the PCB for the memory module can therefore be effectively reduced. As a result, devices having memory modules can be made more compact.

The PCB used to manufacture the above-described memory module preferably includes a rectangular, panel-type PCB. Multiple memory chip pad groups, made up of multiple pads corresponding to the multiple memory chips, are arranged on both sides of the PCB. Each of the memory chips includes multiple lead lines. Connectors are formed along one edge of the PCB for electrically connecting the memory chip pad groups with an external device. Multiple damping chip pad groups, each having built-in damping chips, are arranged alongside memory chip pad groups to electrically connect the connectors and dampen the signal noises.

The multiple memory chip pad groups are arranged at regular intervals in a single line along the length of the PCB. In addition, each memory chip pad group includes multiple pads aligned with the lead lines of the memory chips. The memory chip pad groups are arranged such that sides of the memory chips where lead lines are formed are located parallel to the longitudinal edge of the PCB.

In the connector, multiple connection pads are electrically connected to the memory chip pads. The connection pads are arranged at regular intervals along the longitudinal edge of the connector and are constructed of thin metal panels designed to help exchange electrical signals without resistance. Two damping chip pad groups are positioned adjacent to each of the adjacent memory chip pad groups. The damping chips are arranged in a line parallel to the lateral edges of the PCB. The height of the longitudinal edge of the PCB can therefore be reduced.

BRIEF DESCRIPTION OF THE DRAWINGS

The foregoing and additional objects and advantages of the present invention will become more readily apparent through the following detailed description of preferred embodiments thereof, made with reference to the accompanying drawings, in which.

DETAILED DESCRIPTION OF PREFERRED EMBODIMENTS

Various embodiments of the present invention now will be described more fully with reference to the accompanying drawings. It should be noted, however, that the principles and aspects of the present invention set forth herein may be embodied in many different forms and should not be construed as being limited to the specific embodiments disclosed. These embodiments are provided by way of example and not of limitation.

Figure 1:
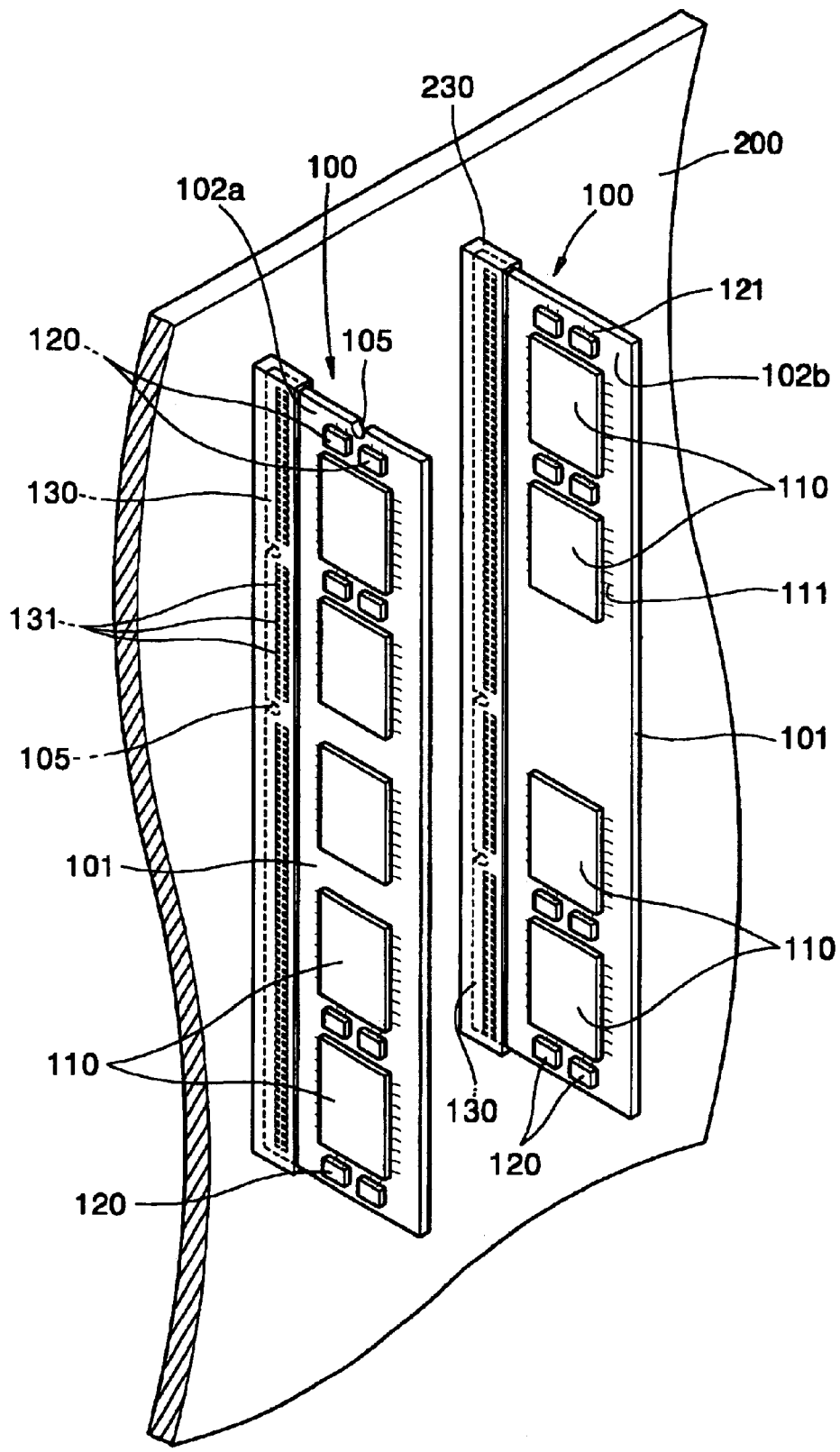
FIG. 1 is an elevated perspective view of a memory module constructed according to a preferred embodiment of the present invention.

FIG. 1 is an elevated perspective view of a computing device 200 equipped with memory modules 100 constructed according to a preferred embodiment of the present invention. To illustrate both sides of the memory module 100, a front side 102a of the memory module 100 is shown on the left, and a rear side 102b of the memory module 100 is shown on the right.

Referring to FIG. 1, the memory module 100 constructed according to a preferred embodiment of the present invention includes a rectangular, panel-type printed circuit board (PCB) 101. Multiple memory chips 110 are arranged along the length of the PCB 101. Each memory chip includes multiple lead lines 111. Connectors 130, formed along one edge of the PCB 101, are supported physically on the external computing device 200 and communicate electrically with the memory chips 110. More specifically, the memory chips 110 transmit electrical signals to and receive electrical signals from the external device 200 through the connectors 130. Damping chips 120 are positioned adjacent to the memory chips 110 and are configured to eliminate overshooting and undershooting of the electrical signals between the connectors 130 and the memory chips 110 caused by external noise.

Figure 2A:
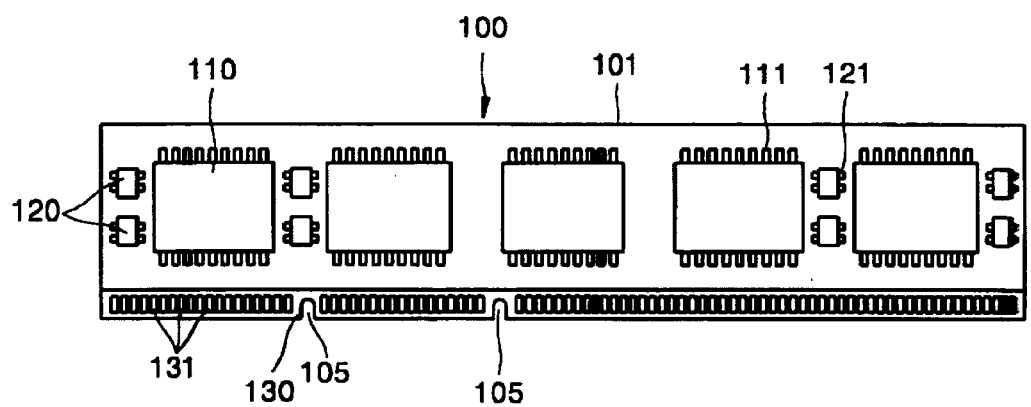
FIGS. 2A and 2B are plan views showing a front side and a rear side, respectively, of the memory module of FIG. 1.
Figure 2B:
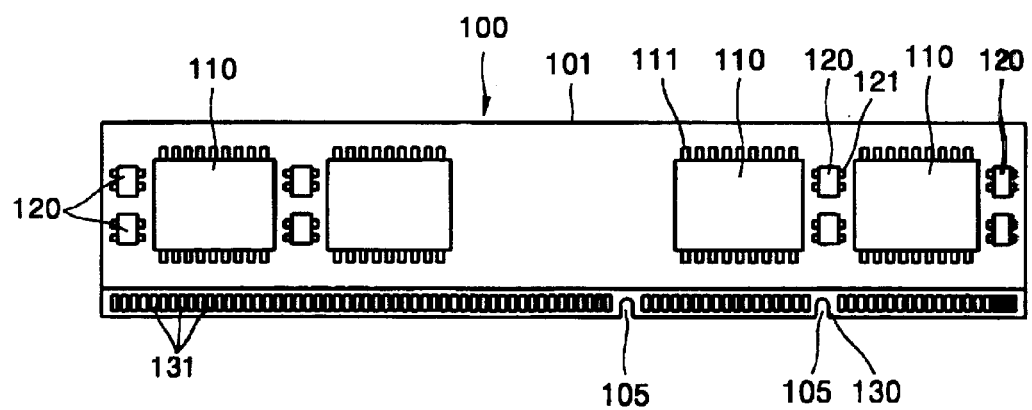

FIGS. 2A and 2B are plan views of the memory module 100 of FIG. 1. FIG. 2A shows a front side 102a of the memory module 100, while FIG. 2B shows a rear side 102b of the memory module. Referring to FIGS. 2A and 2B, a memory module 100 is preferably formed from a rectangular, panel-type PCB 101 having printed circuits formed thereon. The printed circuits include metal wires arranged within the PCB 101 to electrically interconnect a plurality of memory chips 110 arranged on the PCB 101.

Volatile memory devices, such as Synchronized Dynamic Random Access Memories (SDRAMs), for example, can be used as the memory chips 110. The multiple memory chips 110 are preferably rectangular, panel-type chips having a longitudinal edge longer than a lateral edge thereof. The memory chips 110 can be arranged on both sides 102a, 102b of the PCB 101 along its length. Multiple lead lines 111 protrude at regular intervals from the longitudinal edges of each memory chip 110. The longitudinal edges of the memory chips 110 are preferably arranged in parallel with the longitudinal edge of the PCB 101. The lead lines 111 are connected to connection pads 131 of the connectors 130 through the metal wires arranged in the PCB 101.

Each memory module 100 preferably includes a total of nine memory chips 110, with five memory chips 110 arranged on the front side 102a of the PCB 101 and four memory chips 110 arranged on the rear side 102b of the PCB 101. The number of the memory chips 110 on the PCB 101 can be adjusted depending on the needed memory capacity for the system in which the memory module 100 is to be used.

The connectors 130 are preferably arranged in a belt-like fashion on the surface of the PCB 101 at a short distance away from the lower longitudinal edge. In the connectors 130, connection pads 131 electrically connect with metal wires on the inside of the PCB 101, which are in turn connected to the printed circuit wires of the PCB 101. Referring also to FIG. 1, the connection pads 131 are made of highly conductive metals that can smoothly transfer electrical signals between the external device 200 and the memory chips 110. The connectors 130 include multiple anti-deformation grooves 105 arranged at regular intervals along the length of the connector 130 to prevent the deformation of the PCB 101. The connectors 130 correspond to connectors 230 of the external device 200 to exchange data by transmitting/receiving signals to/from the memory chips (e.g., SDRAM) 110 and to firmly physically support the memory module 100 on the external device 200.

In addition, to eliminate noises that can be caused by the exchange of electrical signals between the memory chips 110 and the external device 200, and to enhance the signal resolution, damping chips 120 are arranged in horizontally-oriented pairs adjacent to the memory chips 110. More particularly, the two damping chips 120 in each pair are preferably arranged in a line parallel to the lateral edges of the PCB 101. Longitudinal edges of the damping chips 120 are also preferably arranged parallel to the lateral edges of the PCB 101. The damping chips 120 are preferably four-array register chips that have multiple resistance elements. The damping chips 120 transmit the signals from the external device 200 to the memory chips 110 without overshooting the signals.

Multiple lead lines 121 are formed on each of the longitudinal edges of the damping chips 120. The multiple lead lines 121 are connected to lead lines 111 of the memory chips 110. The lead lines 111 of the memory chips 110 are electrically connected to connection pads 131 formed in the connection connectors 130 through internal metal wires of the PCB 101 printed circuits to exchange input/output signals with the external device 200. By arranging damping chips 120 adjacent to lateral edges of the memory chips 110, the height of the PCB 101 can be drastically reduced and the size of the memory module can thereby be reduced.

Figure 3:
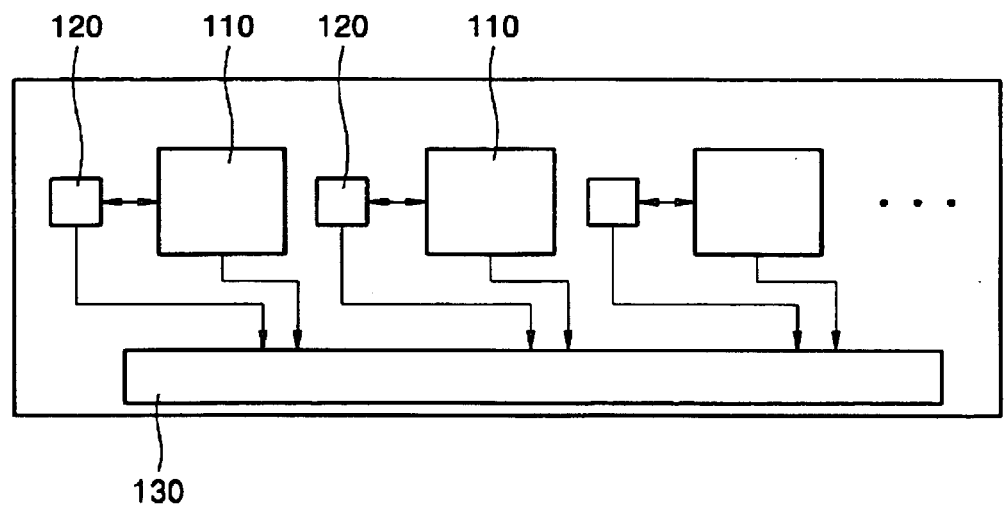
FIG. 3 is a block circuit diagram of a printed circuit board (PCB) for the memory module of FIG. 1.

FIG. 3 is a block diagram illustrating electrical communication between components of the memory module 100 of FIGS. 2A and 2B. Referring to FIGS. 1, 2A, 2B, and 3, when an electrical signal from the external device 200 is transmitted to the PCB 101 through the connection pad 131 of the connector 130, the input signal is transmitted to the damping chip 120. The damping chip 120 damps out electrical signal noises to filter only the real signal through to the input lead of the memory chip 110. Depending on the signal transmitted to the memory chip 110, data may be transmitted from the external device 200 and saved inside the memory chip 110, or data saved in the memory chip 110 may be converted into an electrical output signal and transmitted to the damping chip 120 through an output lead of the memory chip 110. The output signal is transmitted from the damping chip 120 to the external device 200 through the connector 130. In this embodiment, the external device 200 and the memory chip 110 can communicate without any noise by exchanging data smoothly through the damping chip 120.

In a memory module 100 configured according to the preferred embodiment of the present invention, since damping chips 120 are arranged adjacent to the memory chips 110, the space between the connector 130 and the memory chip 110 can be reduced. The height of the PCB for the memory module 100 can therefore be decreased. For example, the overall height of the memory module 100 can be reduced to fit in next generation devices having a size of 900 mm or less.

Figure 4A:
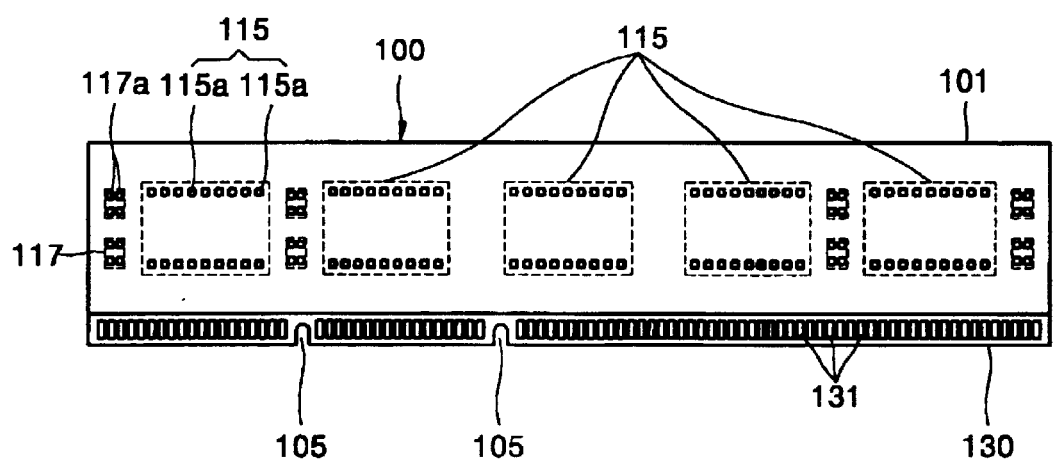
FIGS. 4A and 4B are plan views illustrating a front side and a rear side, respectively, of the PCB for the memory module of FIG. 1.
Figure 4B:
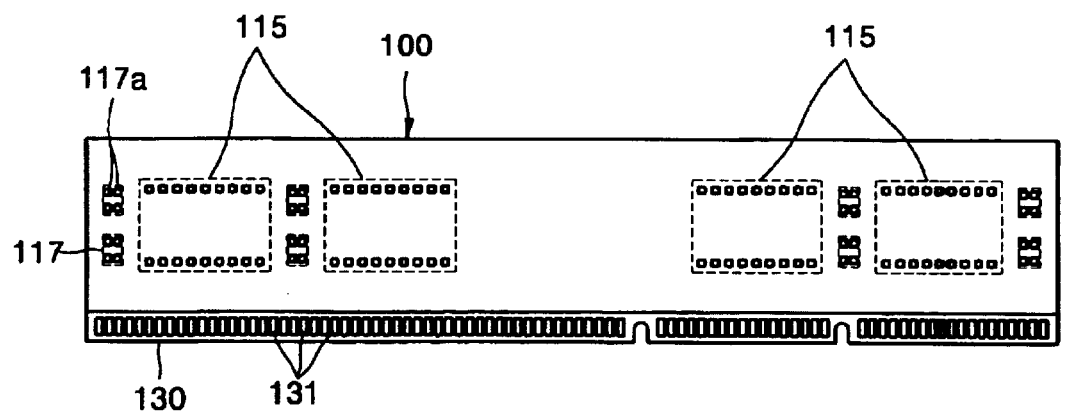

FIGS. 4A and 4B are plan views illustrating a front side 102a and a rear side 102b of the PCB 101 for the memory module according to yet another aspect of the present invention. Referring to FIGS. 1, 4A and 4B, a memory module 100 preferably includes a rectangular, panel-type PCB 101 having multiple memory chip pad groups 115 made up of multiple pads 115a. The chip pad groups 115 correspond to the plurality of memory chips 110 arranged on both sides of the PCB 101. Connectors 130 are formed along one edge of the PCB 101 for electrically connecting the memory chip pad groups 115 to the external device 200. Multiple damping chip pad groups 117, having built-in damping chips, are arranged between memory chip pad groups 115 and electrically connected to connectors 130 to dampen signal noises.

The memory chip pad groups 115 are arranged at regular intervals in a single line along the length of the PCB 101. In addition, the multiple pads 115a of each memory chip pad group 115 are aligned with the lead lines 111 of a corresponding memory chip 110 on the PCB 101. In other words, multiple pads 115a are arranged adjacent to the longitudinal edges of a corresponding memory chip 110 to form a memory chip pad group 115. The memory chip pad groups 115 are therefore preferably arranged in lines that are disposed parallel to the longitudinal edge of the PCB 101. Multiple connection pads 131 of the connector 130 are connected electrically to the memory chip pads 115a. The connection pads 131 are preferably made of thin metal and arranged at regular intervals near the longitudinal edge of the connector 130.

Each of the damping chip pad groups 117 preferably includes a plurality of damping chip pads 117a that correspond to the lead lines 121 of a corresponding damping chip 120 on the PCB 101. Two damping chip pad groups 117 are preferably arranged adjacent to a memory chip pad group 115 in a line parallel to the lateral edge of the PCB 101. By locating multiple damping chip pad groups in a line parallel to the lateral edge of the PCB 101, the length of the PCB 101, as well as its height, can be reduced. Using a PCB 101 with the foregoing configuration, the components (e.g., memory chips 110 and damping chips 120) of a memory module 100 can be arranged having a high density so that the same amount of memory can be arranged into a smaller module 100. As can be seen from FIGS. 4A and 4B, this configuration also results in some of the damping chip pad groups 117 being located in a space between adjacent memory chip pad groups 115.

The damping chips 120 used for the memory module 100 can be four-array register chips configured using a combination of a capacitor and a resistor. More particularly, a capacitor and a resistor can be connected in parallel to form a damping circuit 120. SDRAM, Rambus DRAM, or Electrically Eraseable Programmable Read Only Memory (EEPROM) can be used for the memory chips 110, for example. The memory chips 110 are preferably arranged on the surface of the PCB 101 based on the size of the chips 110. The number of pads arranged on the surface of the PCB 101 preferably corresponds to the number of lead lines that protrude from the chips.

In addition, metal wires are preferably formed in the PCB 101. The metal wires are preferably arranged in a straight line between the connection pad 131 of the connector 130 and the lead lines 121 extending from the damping chip 120. This direct, straight-line metal wiring helps prevent damping of the electrical signal that can occur in longer wires due to the line resistance of the metal wires.

Figure 5:
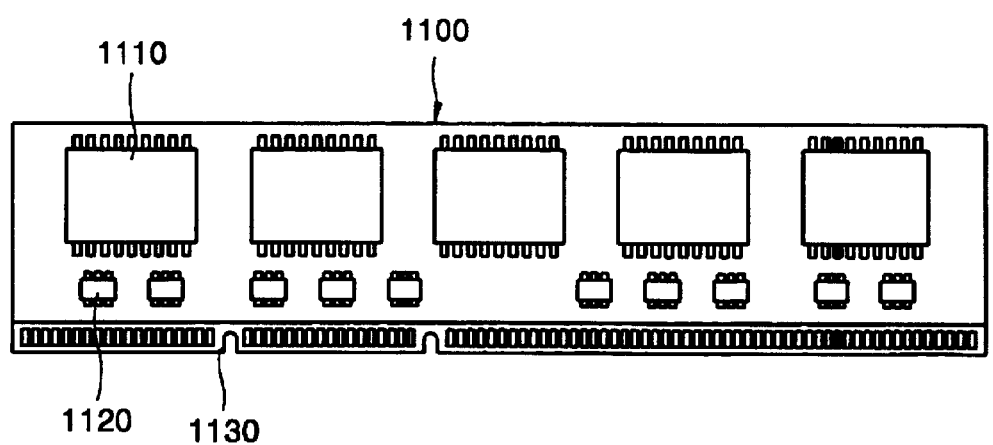
FIGS. 5 and 6 are plan views showing a memory module arrangement according to the prior art.
Figure 6:
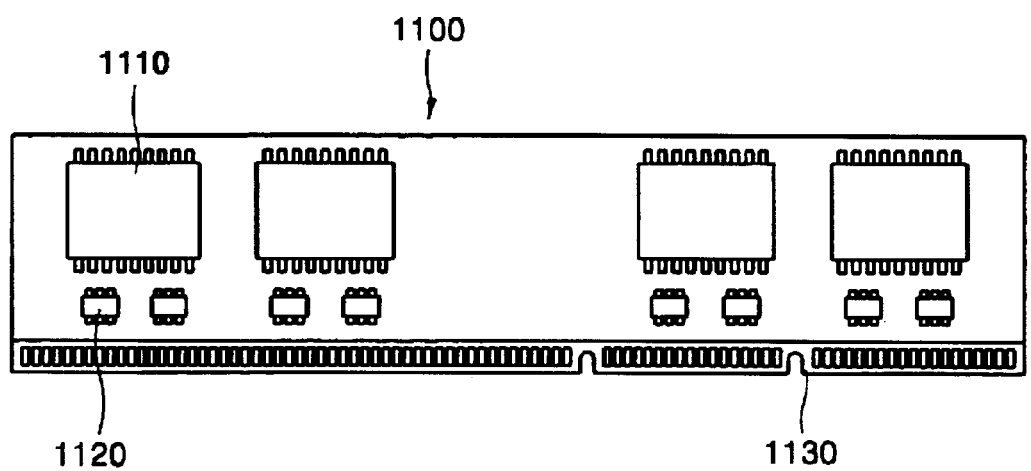

Furthermore, the distance from the connection pad 131 of the connector 130 to the lead line 111 of the memory chip 110 is drastically reduced when compared with that of the existing memory module 1100 (see FIG. 5). In particular, the metal line is not directed to the external side of the memory chip 110 via the damping chip 120. The metal line instead passes through the PCB 101 beneath the memory chip and is directed from the connection pad 131 of the connector 130 to the lead line 121 of the damping chip 120. As a result, in the memory module constructed according to this embodiment of the present invention, even though a path between the connector 130, the damping chip 120, and the memory chip 110 may be longer, the electrical signal path length is not increased and signal damping can be reduced or prevented.

As described previously, in the PCB 101 configured according to a preferred embodiment of the present invention, the damping chips 120 are preferably arranged adjacent to a lateral edge of one or more of the longitudinally-aligned memory chips 101. The height and size of the memory module 100 can thereby be readily reduced. In addition, in the PCB 101 constructed according to a preferred embodiment of the present invention, by arranging the longitudinal edges of the memory chips parallel with the longitudinal edge of the PCB, the height of the PCB can reduced.

Although various preferred embodiments have been shown and described herein, various modifications and adaptations will be apparent to those skilled in the art. The scope of the invention as defined by the appended claims should therefore be interpreted to encompass all such modifications and adaptations.

What is claimed is:

1. A printed circuit board (PCB) for a memory module, said PCB comprising:

a PCB panel;

a plurality of memory chip pad groups each comprising multiple pads, said memory chip pad groups corresponding to a plurality of memory chips arranged on both sides of the panel, each of said memory chips comprising a plurality of lead lines;

a plurality of connectors arranged along an edge of the panel, said connectors configured to electrically connect the memory chip pad groups to an external device; and a plurality of damping chip pad groups arranged adjacent to a lateral edge of one or more memory chips between adjacent memory chip pad groups, each damping chip pad group comprising a plurality of built-in damping chips, said damping chip pad groups configured to electrically connect to the connectors and dampen signal noises.

2. The PCB according to claim 1, wherein the multiple memory chip pad groups are arranged at regular intervals in a line parallel to a longitudinal edge of the PCB.

3. The PCB according to claim 1, wherein the memory chip pad groups are configured to accommodate the plurality of lead lines formed on longitudinal edges of the memory chips.

4. The PCB according to claim 1, wherein the longitudinal edges of the memory chip are arranged parallel to the longitudinal edge of the PCB.

5. The PCB according to claim 1, wherein the connectors are formed along a longitudinal edge of the PCB panel.

6. The PCB according to claim 1, wherein the connectors comprise a plurality of connection pads electrically connected to the memory chip pads.

7. The PCB according to claim 6, wherein the connection pads are arranged at regular intervals near a longitudinal edge of the connectors.

8. The PCB according to claim 7, wherein the connection pads are made of a thin metal film.

9. The PCB according to claim 1, wherein two damping chip pad groups are arranged adjacent to the lateral edge of one or more of the memory chips.

10. The PCB according to claim 9, wherein the two damping chip pad groups are arranged in a line parallel to a lateral edge of the PCB.

11. A memory module comprising:
  a printed circuit board (PCB) comprising a PGB panel and connectors formed along an edge of the PCB panel;
  a plurality of memory chips, each memory chip comprising multiple lead lines, said memory chips arranged in a line substantially parallel to a longitudinal edge of the PCB; and
  a plurality of damping chips, wherein one or more of the damping chips are arranged adjacent to a lateral edge of one or more of the memory chips arranged between adjacent memory chips, and wherein each of said damping chips comprises a damping circuit configured to damp noise in electrical signals exchanged between the memory chips and the connectors.

12. The memory module according to claim 11, wherein the memory chips are rectangular in shape, and wherein multiple lead lines are formed on longitudinal edges of the memory chips.

13. The memory module according to claim 12, wherein the longitudinal edges of the memory chip are arranged parallel to the longitudinal edge of the PCB.

14. The memory module according to claim 13, wherein each of the memory chips comprises a volatile memory chip.

15. The memory module according to claim 14, wherein the memory chip comprises a Synchronized Dynamic Random Access Memory.

16. The memory module according to claim 11, wherein the connectors comprise multiple connection pads electrically connected to the lead lines of the memory chips through metal wires formed inside the PCB panel.

17. The memory module according to claim 11, wherein each damping chip comprises at least one resistor.

18. The memory module according to claim 17, wherein each damping chip comprises a four-array register.

19. The memory module according to claim 17, wherein each damping chip further comprises a capacitor.

20. The memory module according to claim 11, wherein the damping circuit comprises a resistor and a capacitor connected in parallel.

21. The memory module according to claim 11, wherein two damping chips are arranged in a line parallel to a lateral edge of the PCB.

22. A method for constructing a memory module, said method comprising:
  arranging a plurality of memory chips on a printed circuit board (PCB) in a line parallel to a longitudinal edge of the PCB, wherein longitudinal edges of the memory chips are disposed parallel to the longitudinal edge of the PCB; and
  arranging a plurality of damping chips on the PCB adjacent to between the lateral edges of the adjacent memory chips.

23. A method according to claim 22, further comprising arranging multiple damping chips adjacent to the lateral edge of one or more memory chips in a line parallel to a lateral edge of the PCB.

* * * * *

UNITED STATES PATENT AND TRADEMARK OFFICE
CERTIFICATE OF CORRECTION

PATENT NO. : 6,891,729 B2  Page 1 of 1
APPLICATION NO. : 10/197156
DATED : May 10, 2005
INVENTOR(S) : Ko et al.

It is certified that error appears in the above-identified patent and that said Letters Patent is hereby corrected as shown below:

On the title page, item [56]:
In the References Cited, please replace "5/2002 Nakase et al." with --5/2001 Nakase et al.--.
At column 7, line 32, please replace "comprising a PGB panel" with --comprising a PCB panel--

Signed and Sealed this

Tenth Day of October, 2006

JON W. DUDAS
*Director of the United States Patent and Trademark Office*

UNITED STATES PATENT AND TRADEMARK OFFICE
CERTIFICATE OF CORRECTION

PATENT NO. : 6,891,729 B2  
APPLICATION NO. : 10/197156  
DATED : May 10, 2005  
INVENTOR(S) : Ko et al.

It is certified that error appears in the above-identified patent and that said Letters Patent is hereby corrected as shown below:

On Title Page (item 56)
In the References Cited, please replace "5/2002 Nakase et al." with --5/2001 Nakase et al.--.
Column 7, line 32, please replace "comprising a PGB panel" with --comprising a PCB panel--

Signed and Sealed this

Fifth Day of December, 2006

JON W. DUDAS
*Director of the United States Patent and Trademark Office*